United States Patent [19]

Meckel

[11] 4,299,678
[45] Nov. 10, 1981

[54] MAGNETIC TARGET PLATE FOR USE IN MAGNETRON SPUTTERING OF MAGNETIC FILMS

[75] Inventor: Benjamin B. Meckel, Del Mar, Calif.

[73] Assignee: Spin Physics, Inc., San Diego, Calif.

[21] Appl. No.: 59,817

[22] Filed: Jul. 23, 1979

[51] Int. Cl.$^3$ .............................................. C23C 15/00
[52] U.S. Cl. ............................... 204/192 M; 204/298
[58] Field of Search ............... 204/192 R, 192 M, 298

[56] References Cited

U.S. PATENT DOCUMENTS

| | | | |
|---|---|---|---|
| 2,451,725 | 10/1948 | Franklin | 428/167 X |
| 3,578,173 | 5/1971 | Streeton | 210/321 |
| 3,711,362 | 1/1973 | Ballard | 428/167 X |
| 3,956,093 | 5/1976 | McLeod | 204/192 |
| 4,060,470 | 11/1977 | Clarke | 204/192 R |
| 4,094,761 | 6/1978 | Wilson | 204/192 M |

FOREIGN PATENT DOCUMENTS 2651382  5/1978  Fed. Rep. of Germany ...... 204/298

OTHER PUBLICATIONS

B. I. Bertelsen, Sputtering Cathode For Magnetic Film Deposition, IBM Technical Disclosure Bulletin, vol. 6, No. 2, Jul. 1963, pp. 69–70.
J. L. Vossen and W. Kern, editors, Thin Film Processes, Academic Press, New York, 1978, pp. 94, 138.

*Primary Examiner*—Delbert E. Gantz
*Assistant Examiner*—William Leader
*Attorney, Agent, or Firm*—Robert F. Cody

[57] ABSTRACT

The advantages of magnetron sputtering can be applied to magnetic target materials by substantially reducing the saturation magnetization of the target material temporarily, such as by heating the target material to its Curie point, and magnetron sputtering the magnetic material while in such a state of reduced magnetization. Disclosed herein is a magnetic target plate which is structured to facilitate heating of the plate to its Curie point by the thermal energy inherent in the conventional sputtering process.

8 Claims, 4 Drawing Figures

MAGNETIC TARGET PLATE FOR USE IN MAGNETRON SPUTTERING OF MAGNETIC FILMS

CROSS-REFERENCE TO RELATED APPLICATIONS

Reference is made to the commonly assigned U.S. Application Ser. No. 059,932, filed concurrently herewith in the names of B. B. Meckel and E. I. Bromley entitled Magnetron Sputtering of Magnetic Materials.

BACKGROUND OF THE INVENTION

The present invention relates to the art of forming magnetic films via the magnetron sputtering technique, and more particularly to improvements in magnetic target plates which are adapted for use in magnetron sputtering apparatus.

Sputtering is a well-known and widely accepted technique for depositing thin films of a desired material on a substrate. In the basic sputtering process, a target comprising the material to be deposited is bombarded by gas ions, typically argon ions, accelerated by an intense electric field. Such ion bombardment is carried out in a vacuum chamber and serves to eject, via momentum transfer, atomic sized particles from the target in all directions. Some of these particles traverse the vacuum chamber and settle upon the substrate surface as a thin film. In order to prevent the target material from overheating during the sputtering process, conventional sputtering systems typically comprise some means of cooling the target to its lowest possible temperature.

By its nature, the basic sputtering process is slow and inefficient compared with other deposition techniques; that is to say, the sputtered film accumulates at a relatively slow rate, say, 1-3 micrometers per hour, and the electric power required to produce a sputtered film is relatively high. Further, there is a tendency for the substrate to overheat and suffer radiation damage due to the lengthy film-growing procedure and the high energy of the sputtered particles.

In the recent years, the above disadvantages associated with the sputtering process have been alleviated to a major extent by the development of the magnetron. Such a device comprises an elongated array of permanent magnets which is positioned behind the plane of the target material during the sputtering process. When the target is non-magnetic, magnetic lines of force emanating from the magnets pass through the target and extend into the region of the gas plasma produced by the electric field. These magnetic lines of force extend parallel to the target surface and, hence, perpendicular to the plasma-producing electric field. In cooperating with the electric field, the magnetic field above the target surface confines secondary electrons ejected from the target to the vicinity of the target surface and imparts a spiral motion thereto, thereby increasing the number of collisions such electrons have with the gas molecules of the plasma. The result is a densification of the gas plasma in the vicinity of the target surface which, in turn, acts to intensify the ion bombardment of the target and to ultimately increase the normal deposition rate by up to an order of magnitude.

While the magnetron has been used with great success in the sputtering of non-magnetic materials to produce non-magnetic films, the same cannot be said of its use in the formation of magnetic films. In attempting to magnetron sputter material from a magnetic target, one finds that the target acts as a shunt to the magnetic field lines emanating from the magnetron. Thus, the field lines which ordinarily penetrate the non-magnetic target and serve to densify the plasma near the target surface are, in effect, short-circuited through the magnetic target material and are thereby prevented from entering the region of the plasma.

While considerable thought, time and effort have been given by those skilled in the art toward providing a solution to the above-identified problem of magnetron sputtering of magnetic materials, only limited success has been achieved to date. One solution has been to use a very thin magnetic target, one so thin as to be incapable of shunting the entire magnetic field of the magnetron. Such an approach has the effect of forcing some of the magnetic flux outside the plane of the target surface and into the plasma region. The major problems with this approach, however, are that the target is relatively expensive to prepare and, owing to its thin dimension, is rapidly depleted before any substantial film can be accumulated on the receiving substrate. Another solution has been to modify the position and geometry of the permanent magnets of the magnetron. The idea is to produce a magnetic field at the surface of its target by using magnets which are spaced above and/or outside the plasma region of the vacuum chamber. This technique, however, produces a non-uniform deposition; moreover, it is difficult, at best, to produce a magnetic field of sufficient intensity at the target surface. To date, neither of these approaches has been capable of producing a sputter-deposited magnetic layer at a rate which compares favorably to the rate at which non-magnetic materials can be deposited.

In the above-referenced U.S. Patent Application Ser. No. 059,932, there is disclosed a method and apparatus for sputter-depositing magnetic films using the magnetron sputtering technique. The method comprises the step of temporarily substantially reducing the saturation magnetization of the material, such as by heating a magnetic target plate to its Curie point. While in a substantially demagnetized state, the plate does not present the aforementioned shunting problems, and the plate can be magnetron sputtered, in the conventional manner, as a non-magnetic material. The sputter-deposited layer, being deposited at a temperature below the Curie point, has been found to exhibit substantially the same magnetic properties as the magnetic target plate before and after the plate is heated.

In the aforementioned application, the desirability of using the thermal energy inherent in the sputtering process to heat the magnetic target to its Curie point is mentioned. To make use of this energy, the sputtering system is operated for a time in the conventional diode mode, and then switched to the magnetron mode after the target temperature has reached the Curie point. While such a heating technique has been proven capable of providing the requisite thermal energy to the magnetic target plate, it does require considerable time and electrical power to raise a conventional magnetic target plate to its Curie point.

SUMMARY OF THE INVENTION

In view of the foregoing, it is a primary object of this invention to reduce the power requirements for heating a magnetic target plate to its Curie temperature in a magnetron sputtering system.

Another object of the invention is to provide an improved magnetic target structure which, by its design, is readily heatable to its Curie point, such as by the thermal energy inherent in the conventional diode sputtering process.

According to the invention, there is provided an improved magnetic target plate which is particularly well adapted for use with magnetron sputtering apparatus for the purpose of forming magnetic films. The target plate of the invention comprises a relatively thin plate-like member made of a magnetic material, and means defining localized regions of high magnetic reluctance in the plate member. These regions of relatively high reluctance function to force magnetic flux, which is ordinarily shunted by a magnetic target plate in a magnetron sputtering system, to extend outside the volume of the plate and into the plasma region of sputtering system. This has the effect of densifying the plasma in the vicinity of the localized regions of high reluctance which, in turn, has the effect of intensely heating such areas. According to a preferred embodiment, the localized regions of high reluctance are defined by one, and preferably, three or more, relatively deep and narrow grooves in the plate-like member. In addition to increasing the magnetic reluctance of the magnetic plate and thereby causing magnetic flux in the plate to arc into the plasma region of the sputtering system, such grooves are advantageous from the standpoint that they act to trap thermal energy in the lands between them; moreover, the grooves enhance the heating of those portions of the magnetic plate directly beneath them by restricting the heat flow through such portions.

The invention and its advantages will be better understood from the ensuing detailed description of preferred embodiments, reference being made to the accompanying drawings.

DETAILED DESCRIPTION OF PREFERRED EMBODIMENTS

Figure 1:
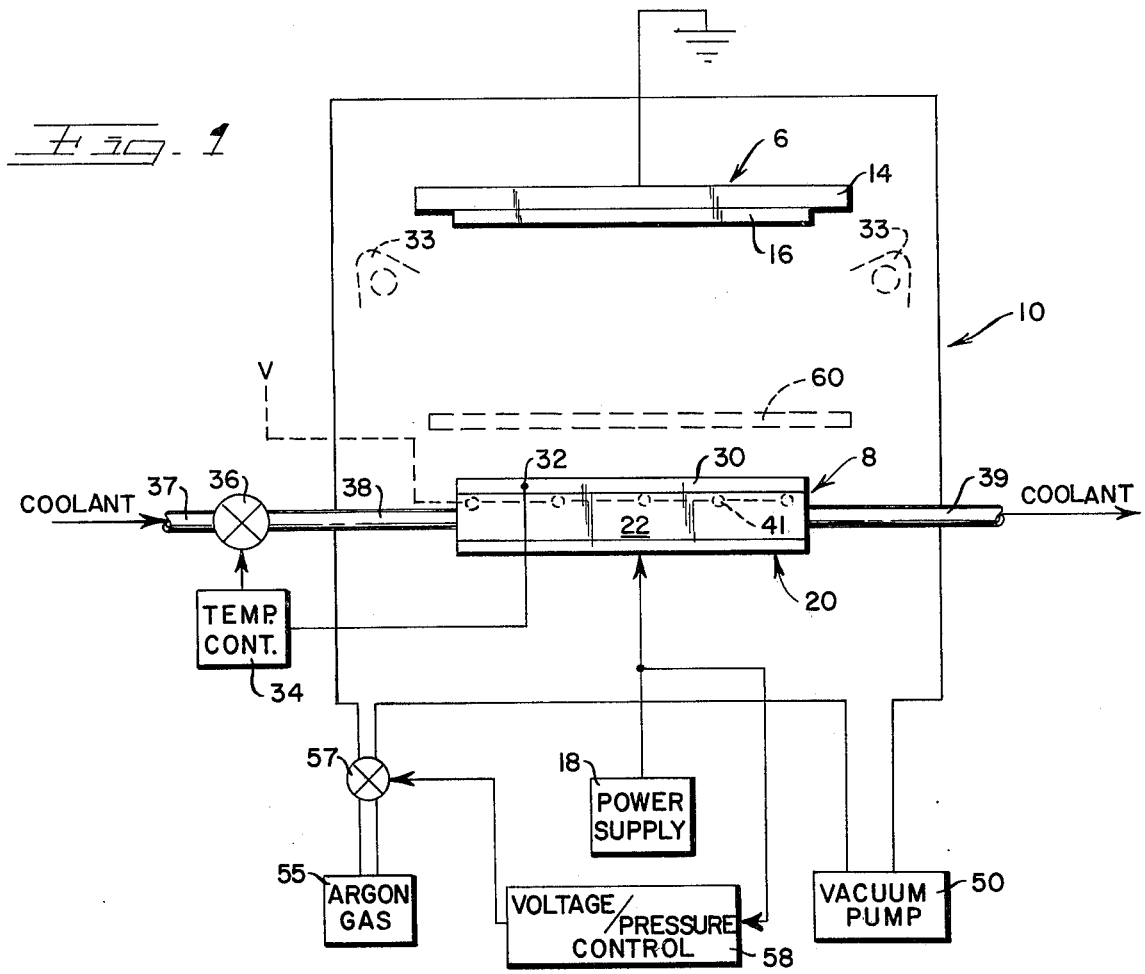
FIG. 1 is a schematic illustration of a planar magnetron sputtering apparatus of the type in which the invention has utility.

Referring now to the drawings, FIG. 1 schematically illustrates a planar magnetron sputtering apparatus of the type in which the invention is particularly useful. The basic sputtering apparatus comprises an anode 6 and a cathode 8, both of which are disposed in a vacuum chamber 10. The anode 6 may be in the form of an electrically conductive plate 14 which, during the sputtering process, is adapted to support and retain a substrate 16 on which a sputtered film is to be deposited. Typically, the anode is connected to ground potential, as shown, and the cathode 8 is connected to a negative voltage from a power supply 18, either DC or RF, which serves to establish an intense electric field between the anode and cathode. It is this electric field which serves to ionize gas molecules in the region between the anode and cathode and thereby produce a gas plasma comprising free electrons and ions.

Figure 2:
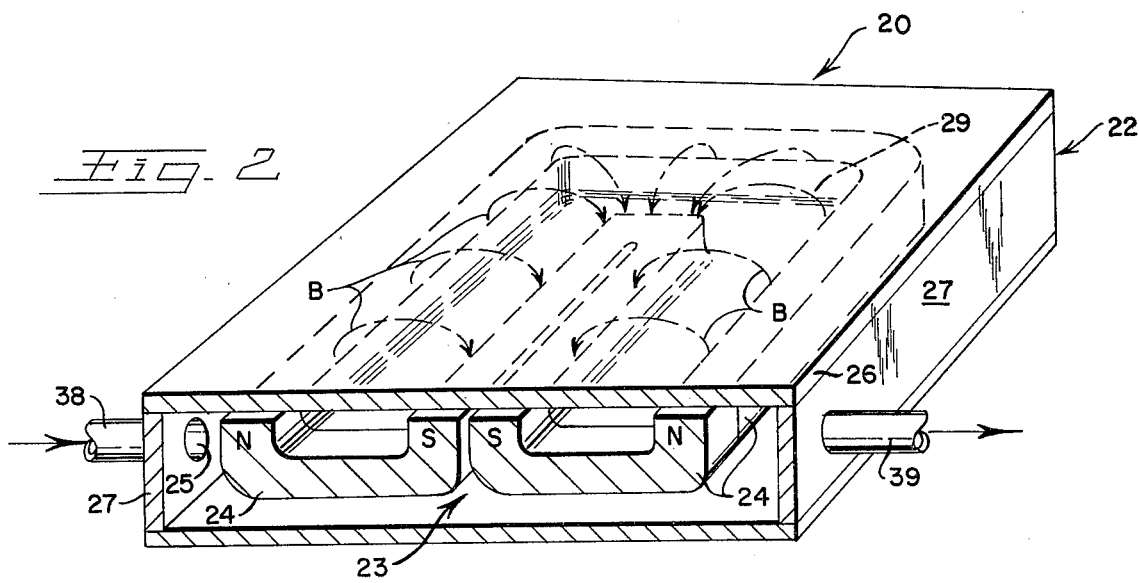
FIG. 2 is a cross-sectional perspective view of a portion of a planar magnetron.
Figure 4:
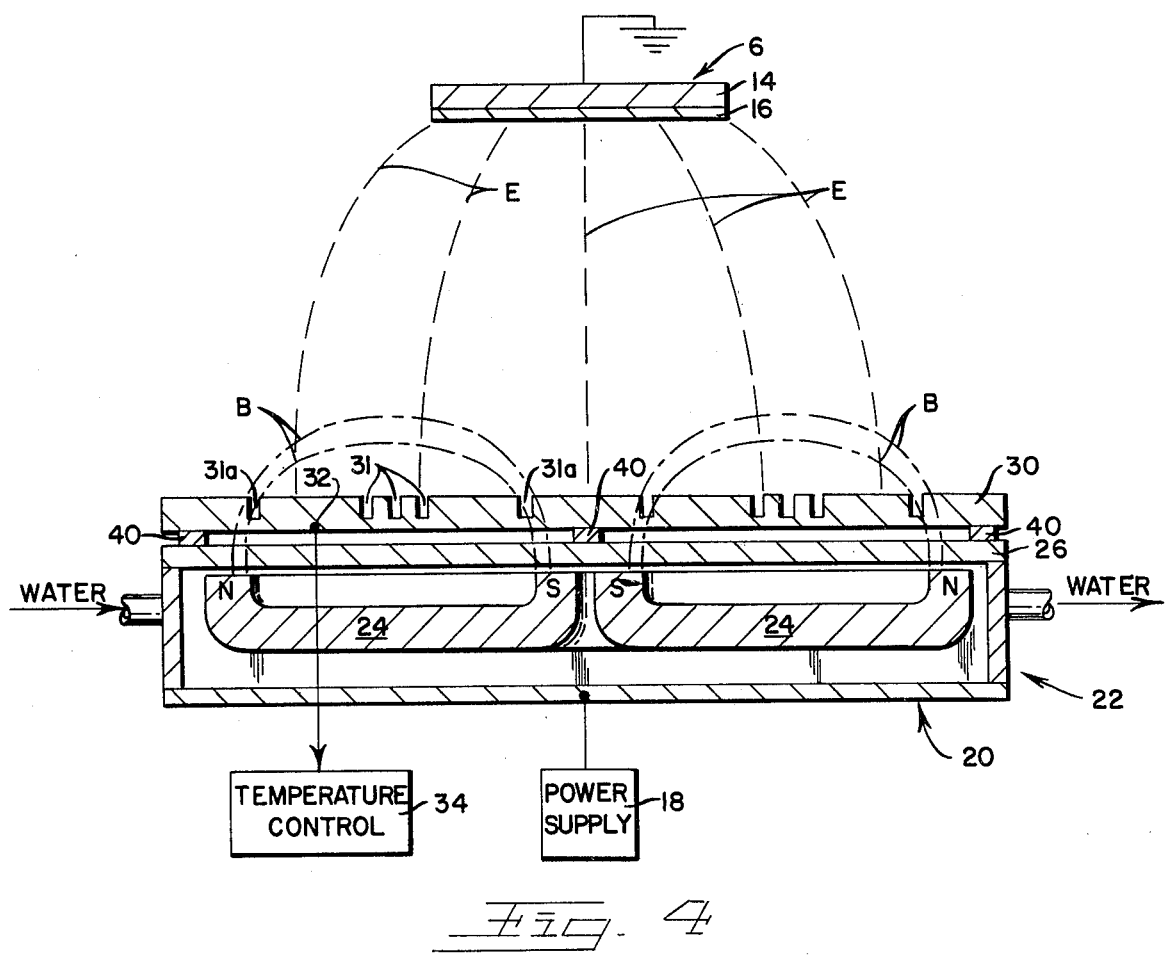
FIG. 4 is a cross-sectional view of the FIG. 3 target positioned in a magnetron sputtering apparatus.

In the specific type of sputtering apparatus shown in FIG. 1, cathode 8 takes the form of a planar magnetron 20 which, as best shown in FIGS. 2 and 4, comprises a non-magnetic (e.g. aluminum or stainless steel) housing 22 in which a closed-loop array 23 of permanent magnets 24 is positioned. Housing 22 is provided with a pair of apertures 25 on opposing side walls 27 to allow a fluid coolant (e.g. water) to flow through. In the cross-sectional perspective view of FIG. 2, approximately one-half of housing 22 and the magnetic array 23 contained thereby has been cut away. Magnetic lines of force B, shown in phantom lines connecting the north and south poles of magnets 24, define a magnetic field 29 above the plane of the magnets, such field resembling a racetrack in shape, approximately one-half of such racetrack being shown in FIG. 2. By virtue of the non-magnetic nature of housing 22 and the proximity of the magnetic pole pieces to top plate 26, the magnetic field lines B project through and above the top plate and extend substantially parallel to the plate surface in the region of the racetrackshaped magnetic field.

Planar magnetron 20 is adapted to support and retain on the upper surface of top plate 26 a target plate 30 comprising the material to be sputtered. When the target plate 30 is non-magnetic, the magnetron sputtering apparatus operates in the conventional fashion; i.e. magnetic field lines from the magnetron pass through the target and act to densify and confine the gas plasma produced by the electric field between the anode and cathode. This densified plasma, as explained above, enhances the ion bombardment of the target surface and thereby significantly increases the deposition rate of the sputtered material on the substrate 16. When, however, the target plate comprises a magnetic or readily magnetizable material, such as, for example, iron, nickel, cobalt, etc., the target material will act to shunt the magnetic flux through it and thereby prevent the presence of a magnetic field in the space separating the anode and cathode. Thus, the advantages of the planar magnetron cannot be realized.

As disclosed in the above-referenced application, it has been found that magnetic target materials can be sputtered using the advantages of the magnetron technique by rendering the target temporarily non-magnetic and by magnetron sputtering the target while in its non-magnetic state. Such a temporary demagnetization of the target can be effected by heating the target material to its Curie temperature or above, at which temperature the magnetic domains of the material become randomly oriented. While in a non-magnetic state, the magnetic lines of force penetrate the target and produce the magnetron effect in the region above the target. Heating of the target to its Curie temperature can be achieved in any one of a variety of ways, such as, for example, arranging infrared radiation-emitting lamps 33 (e.g. quartz iodide lamps) inside the vacuum chamber and directing the radiant output of such lamps at the target surface. Alternatively, electrical resistance heaters 41 imbedded in the top plate 26 of the magnetron housing 22 could be used. Such heaters are energized by a variable voltage source V. Preferably, however, the thermal energy inherent in the sputtering process is used to provide the requisite heating of the target, as described hereinbelow.

Once the target material has exceeded its Curie point by, say, 10 to 15 degrees Centigrade, it is desirable to maintain the target temperature at a substantially constant level. Toward this end, means are provided for continuously monitoring the target temperature and for controlling the target temperature accordingly. To maintain the target temperature substantially constant, a conventional feedback network is provided, such network comprising the combination of a temperature sensor 32, a temperature controller 34 and a valve 36 which controls the flow rate of a fluid coolant 37 (e.g. water) through the housing 22 of the magnetron. Temperature sensor 32 may comprise, for instance, a thermocouple which is arranged in thermal relationship with target plate 30 to sense the temperature of the target directly. Alternatively, an optical pyrometer could be used to sense the target temperature from outside the vacuum chamber. Sensor 32 provides an output signal representative of target temperature to controller 34, such as any conventional thermostat. The output of the temperature controller is used to control the action of a valve 36 which, in turn, controls the flow rate of the coolant. The coolant passed by valve 36 flows, via conduit 38, into the magnetron housing 22 and, upon exchanging thermal energy with the housing and the magnets disposed therein, leaves the magnetron via conduit 39. Since the target plate 30 is in thermal contact with the upper surface of the magnetron housing, the target temperature varies directly with the temperature of the magnetron. By this temperature feedback arrangement, the target temperature is prevented from reaching a temperature at which it begins to melt or undergo undesired physical or chemical changes. It will be appreciated that the target temperature could also be controlled by using the output of controller 34 to control the electrical energy applied to IR lamps (e.g. lamps 33) or resistance heaters 41, when such devices are used to heat the target plate.

Rather than heat the target material to its Curie point by use of external sources, it is much preferred to use the thermal energy inherent in the sputtering process. To do this, it has been found desirable to initially operate the magnetron sputtering apparatus in a conventional diode mode until the target material has reached a predetermined temperature, and then to switch to the magnetron mode. In order to operate in both the standard diode and magnetron modes, power supply 18 should be capable of providing the high voltage (e.g. 2000 volts) which is required for the diode mode of operation, as well as the high current (e.g. 50 amps) which is required for the magnetron mode. Moreover, power supply 18 must have a relatively high impedance (e.g. 1500 ohms) and be capable of suppressing arcing. It should be noted that such a voltage source is not the conventional voltage source which is commonly supplied with either a conventional diode-type sputtering system (which system requires a high voltage, low current supply) or a conventional magnetron system (which system requires a low voltage, high current supply). A suitable high voltage, high current power supply is the Model RDC 3-5000 manufactured by Megavolt Corporation.

When a high voltage (e.g., −2000 volts DC or RF) is applied to the magnetron housing 22 from power supply 18 and the vacuum chamber 10 is filled with an inert gas (e.g. argon) at low pressure (e.g. 25 microns of Hg), the gas will ignite and produce a relatively rarified plasma between the anode and cathode. This is the so-called "diode" mode of operation and the cathode/anode current will stabilize at about 200 milliamps. The gas plasma comprises free electrons and positively charged ions which are accelerated by the applied electric field. Since the cathode is maintained at a negative potential with respect to the anode, the relatively massive positive ions will be attracted toward, and thereby bombard, the target material 30. Such bombardment, of course, increases the target temperature and as the target temperature approaches the Curie point, magnetic flux from the magnetron penetrates the target and densifies the plasma. As indicated above, this plasma densification has the effect of substantially increasing (e.g. by a factor of 10) the rate at which the target is bombarded by ions, as well as the cathode/anode current. As the current increases to several amps, the voltage drops to approximately 700 volts and the system then operates in the conventional magnetron mode. In order to sustain the plasma during the changes in voltage and current, a voltage/pressure control device 58 is used which is capable of monitoring the output voltage of the power supply 18 and controlling the pressure of the working gas (i.e. argon) in the vacuum chamber. Such control is effected via a fast-acting piezoelectric valve 57 which controls the flow of argon gas from a source 55 into the vacuum chamber. Device 58 may be the Plasmaflow instrument made by Vacuum General.

In addition to the high voltage, high current and high output impedance requirements of the power supply, it has been found highly desirable, in order to use the internally-generated heat of the sputtering process to provide the requisite heating of the target material, to space those portions of the target material which are subjected to the magnetron effect (i.e. the aforementioned racetrack area) a small distance away from the upper surface of the magnetron housing 22. Referring to FIG. 4, thin silicon wafers 40, say, for example, 0.020 inches in thickness, are used to support the target plate 30 above the housing 22. These wafers are positioned outside the magnetic racetrack area, along the outer periphery of plate 30, as well as inside the racetrack area, at the central portion of the target plate. In addition to functioning as spacers, wafers 40 also serve to conduct heat away from the center and peripheral areas of the target plate during the sputtering process.

Figure 3:
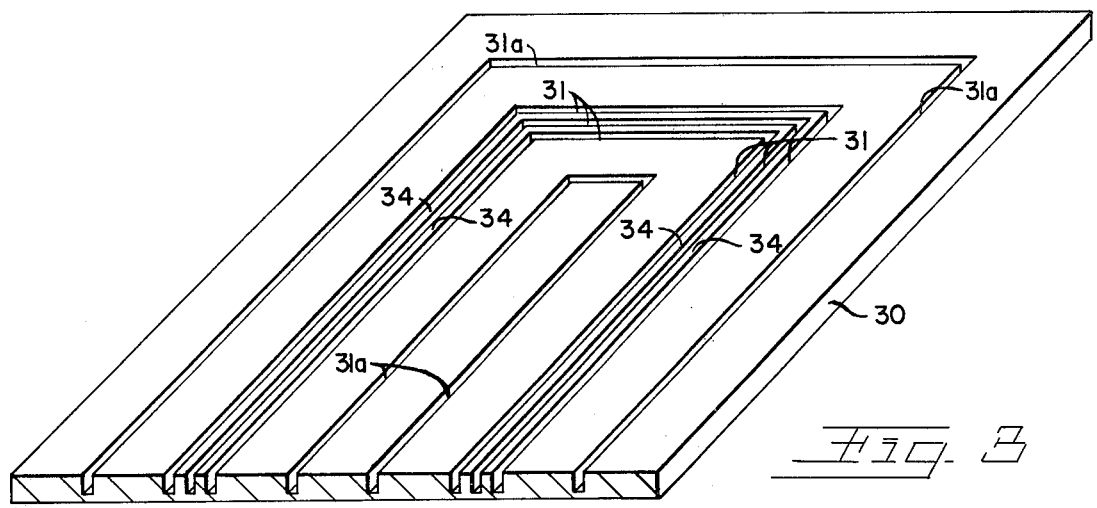
FIG. 3 is a perspective cross-sectional view of a preferred target plate configuration.

According to the present invention, it has been found that the initial heating of the target plate to its Curie point by the internally generated thermal energy of the sputtering process can be facilitated to a major extent by cutting or otherwise forming at least one, and preferably three, relatively deep and narrow endless grooves 31 in the upper surface of the target plate. Such grooves, as shown in FIGS. 3 and 4, are positioned so as to be juxtaposed to the magnetic racetrack of the magnetron when the plate is properly positioned on the upper surface of the magnetron. Ideally, the path of each of the endless grooves will conform to the path of the magnetic racetrack. To facilitate cutting of the grooves, however, each endless groove may comprise four, mutually perpendicular, rectilinear grooves which intersect to form a rectangular endless path. Three of these grooves are shown in the cross-sectional perspective view of FIG. 3. It will be appreciated that the grooves may extend to the edges of the target plate, cutting through adjacent and other grooves. This further facilitates the cutting of the grooves and the groove extensions have been found to produce no adverse effects on the magnetron sputtering process.

Preferably, grooves 31 are equally spaced with narrow (e.g. 0.1 inch wide) lands 34 between them, and each groove extends to a depth of approximately three-quarters of the thickness of the target plate. Preferably, the grooves have a width no greater than approximately 50% of the depth. Such a geometry prevents substantial sputtering of the bottom of the grooves and thereby assures a relatively long target life. It has been found that when ions penetrate the groove structure, they tend to impact the side walls at an oblique angle. As a result, a major fraction of the sputtered atoms are ejected in a forward (i.e. downward) direction, thereby adding target material to the bottom of the groove. Those ions which penetrate to the bottom of the groove eject atoms according to a cosine distribution; thus, only those atoms ejected almost straight up can escape, while most are collected at the walls of the groove.

The effect of the grooves is to selectively increase the magnetic reluctance of the main target body, thereby causing some magnetic flux from the magnetron to bridge the gap defined by the groove. The presence of this magnetic flux in the vicinity of the grooves causes a densification of the plasma in this region and an accompanying increase in temperature of the lands 34 which separate the grooves. Being isolated islands where heat input is high, these lands increase in temperature more rapidly than the bulk target. As the temperature of the lands approaches the Curie point of the magnetic target material, the saturation magnetization decreases, allowing more magnetic flux to extend into the space above the target. This increase in flux above the target further densifies the plasma, causing an increase in the level of ion bombardment and a further increase in target temperature. An avalanche effect now takes place in which more and more magnetic flux penetrates the target plate resulting in an ever-increasing densification of the plasma which, in turn, leads to higher target bombardment rates and high target temperatures. This spiraling cause-and-effect continues until the total magnetic mass between the pole pieces of magnets 24 reaches temperatures greater than the Curie point of the target material and full magnetic field penetration occurs above the target surface. At this time, the aforedescribed temperature feedback network operates to maintain the target temperature at a desired level, say, 15 to 25 degrees Centigrade above the Curie temperature.

From the drawings, it will be appreciated that lands 34 are beneficial from the standpoint that they will become heated much more rapidly than the bulk of the target. Moreover, the region directly below each groove defines a constricted path through which most of the heat is conducted away. The heat transfer process in this constricted region acts to enhance the temperature build-up of the lands and reduces the shunting of magnetic flux.

In addition to forming one or more grooves in the target plate at positions which are centrally located with respect to the poles of magnets 24, it is also desirable to cut grooves 31a directly above the inside edges of the magnetic poles of magnets 24. Such grooves (shown in FIGS. 3 and 4) serve to maintain the temperature of the target mass directly above each of the poles at a temperature below the Curie point so that this area acts as an extended pole tip of each magnet. Moreover, like grooves 31, they act to restrict the flow of thermal energy away from the racetrack portion of the target plate, thereby allowing such portion to be heated to a higher temperature than the other portions of the target.

EXAMPLE

A ferromagnetic target was prepared from Spinalloy, a trademark of Spin Physics, Inc. used to identify a ferromagnetic alloy comprised of about 85% Fe, 10% Si and 5% Al. Spinalloy exhibits magnetic properties up to its Curie temperature of approximately 570° C., and the object of this work was to magnetron-sputter deposit a thin film of Spinalloy onto an aluminum substrate. The Spinalloy was first formed into a target of rectangular shape, such target being 0.25 inches thick, and having a length and width sufficient to totally cover the surface of the planar magnetron. In this example, the plate was $5 \times 12$ inches. The target was preconditioned by cutting a plurality of rectilinear grooves in the surface of the target, as shown in FIG. 3, such grooves being positioned so that, after the target was mounted on the magnetron, the grooves were positioned between the pole pieces of a portion of the ring of magnets comprising the planar magnetron. The grooves were cut to a depth of approximately 0.12 inches and had a width of 0.06 inches. The Spinalloy target was positioned atop the planar magnetron component of the sputtering apparatus shown schematically in FIG. 4. Thin silicon spacers were used to support the target approximately 0.02 inches from the surface of the magnetron. The spacers were positioned outside the region through which the magnetic lines of force were expected to penetrate the target material upon being heated in accordance with the invention. The magnetron, together with the aluminum substrate, were enclosed in a vacuum chamber which was subsequently evacuated to about $10^{-6}$ mm.Hg. The chamber was backfilled with argon by the action of a piezoelectric needle valve controlled by a Plasmaflow instrument made by Vacuum general. The Plasmaflow instrument controlled the argon pressure so that the desired preset discharge voltage was maintained. The starting diode mode pressure was between about 100 and $150 \times 10^{-3}$ mm.Hg. argon. The initial voltage setting was such as to produce a 700 volt potential between anode and cathode. When this voltage was applied between anode and cathode, a plasma discharge took place between the anode and cathode and the target began to heat. To accelerate this heating process, the applied voltage was then increased slowly over a time period of about 3 to 5 minutes to approximately 1500 volts. This had the effect of increasing the anode/cathode current which in turn increased the level of ion bombardment of the target surface. As the target temperature approached its Curie point, the plasma discharge intensified, first in the vicinity of the cut grooves. The pressure of the argon gas within the vacuum chamber was then reduced by the Plasmaflow instrument to a working pressure of about 0.8 to $2.0 \times 10^{-3}$ mm.Hg. Shortly thereafter, a dense plasma covered the Spinalloy target in the vicinity directly above the magnetic assembly of the magnetron. The water supply which cools the magnetron was then turned on and was adjusted by a feedback network to maintain the temperature of the target in the vicinity of the plasma at a temperature between 580° and 600° C., i.e. a temperature well above the Curie temperature of the target, yet not so high as to produce undesirable heating effects, e.g. target melt-down. The sputtering of the target was allowed to continue for several hours, until a magnetic film of Spinalloy approximately 0.005 inches thick was deposited on the aluminum substrate. Upon cooling the substrate to room temperature and removing it from the vacuum chamber, it was determined that the magnetic properties of the sputter-deposited film was substantially identical to that of the original target. Further, it was determined that the stoichiometry of the deposited film was not altered by the sputtering process.

The invention has been described in detail with particular reference to certain preferred embodiments thereof, but it will be understood that variations and modifications can be effected within the spirit and scope of the invention.

What is claimed is:

1. In a magnetron sputtering apparatus of the type which includes means for producing a gas plasma, magnetic means for producing a magnetic field, a magnetic target, means for positioning the magnetic target between the gas plasma and the magnetic means, and means for heating the magnetic target to a temperature at which the saturation magnetization of the magnetic target is substantially reduced, whereby the magnetic field can penetrate the target and densify the gas plasma, the improvement wherein said magnetic target comprises:

means defining selected regions of relatively high reluctance in said magnetic target, said regions cooperating with said magnetic means to cause said magnetic field to extend into the gas plasma and to thereby densify portions of said plasma before the heating means is effective to substantially reduce the saturation magnetization of the target.

2. The apparatus as defined in claim 1 wherein said means defining selected regions of relatively high reluctance comprise at least one groove formed in said target, whereby the thickness of the target is selectively reduced at said groove.

3. The apparatus as defined in claim 1 wherein said target comprises a plate-like member having a substantially uniform thickness, and said means defining selected regions of relatively high reluctance comprises means defining selected regions of reduced thickness in said plate-like member.

4. The apparatus as defined in claim 3 wherein said selected regions of reduced thickness are defined by a plurality of grooves formed in said plate-like member.

5. The apparatus as defined in claim 4 wherein said grooves have a width-to-depth ratio of approximately 1:2.

6. In a method for magnetron sputtering a magnetic target to produce a magnetic film on a substrate spaced from the target, such method comprising the steps of supporting a magnetic target in the path of magnetic flux emanating from a source of magnetization so that the target acts as a shunt to such magnetic flux, producing a gas plasma in the vicinity of the supported magnetic target, attracting gas ions from the gas plasma toward the target, thereby causing atomic-sized particles to become sputtered from the target and onto a substrate spaced from the target, and heating the target to a temperature substantially equal to or above its Curie temperature to render the target non-magnetic, thereby allowing the magnetic flux to penetrate the target and densify the gas plasma, the improvement wherein said heating step is accelerated by restricting the magnetic flux path through selected regions of the target material, whereby magnetic flux passing through the target material is forced outside the volume of the target and into the gas plasma before the target is heated to its Curie temperature.

7. The method according to claim 6 wherein said restriction step is effected by increasing the magnetic reluctance of the target material at selected regions.

8. The method according to claim 7 wherein said increasing step comprises forming at least one groove in the target material to selectively reduce the thickness of the target material at a selected region.

* * * * *